(12) United States Patent
Maguire

(10) Patent No.: US 8,647,766 B2
(45) Date of Patent: Feb. 11, 2014

(54) VOLTAGE DETECTION IN A BATTERY

(75) Inventor: Patrick Daniel Maguire, Ann Arbor, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 262 days.

(21) Appl. No.: 12/820,494

(22) Filed: Jun. 22, 2010

(65) Prior Publication Data

US 2011/0177368 A1    Jul. 21, 2011

(51) Int. Cl.
| | |
|---|---|
| *H01M 10/48* | (2006.01) |
| *H01M 2/24* | (2006.01) |
| *H01R 11/01* | (2006.01) |
| *H01R 4/38* | (2006.01) |
| *H01R 4/42* | (2006.01) |
| *H01M 2/20* | (2006.01) |
| *H01M 2/22* | (2006.01) |
| *H01M 2/10* | (2006.01) |
| *H01R 11/28* | (2006.01) |
| *H01M 10/0525* | (2010.01) |

(52) U.S. Cl.
CPC ........... *H01M 2/206* (2013.01); *H01M 2/22* (2013.01); *H01M 2/1077* (2013.01); *H01M 10/48* (2013.01); *H01R 11/288* (2013.01); *H01M 10/0525* (2013.01); *H01M 10/486* (2013.01); *H01M 2220/20* (2013.01); *Y02T 10/7077* (2013.01)
USPC ............. 429/160; 429/90; 429/152; 429/157; 429/158; 429/159; 439/757; 439/758; 439/765; 439/766; 439/756

(58) Field of Classification Search
CPC ..... H01M 2/1077; H01M 2/206; H01M 2/22; H01M 10/48; H01M 2220/20; H01R 11/2888
USPC .................... 429/90, 152, 157, 158, 159, 160
See application file for complete search history.

(56) References Cited

U.S. PATENT DOCUMENTS

| | | | |
|---|---|---|---|
| 4,522,898 A | | 6/1985 | Esrom |
| 5,578,392 A | * | 11/1996 | Kawamura ...................... 429/99 |
| 6,174,618 B1 | | 1/2001 | Nishiyama et al. |
| 6,340,877 B1 | | 1/2002 | Mita et al. |
| 6,410,184 B1 | | 6/2002 | Horiuchi et al. |
| 6,410,185 B1 | | 6/2002 | Takahashi et al. |
| 6,558,835 B1 | * | 5/2003 | Kurisu et al. ................ 429/159 |
| 6,705,418 B2 | | 3/2004 | Wessman |

(Continued)

FOREIGN PATENT DOCUMENTS

| | | | |
|---|---|---|---|
| WO | 2006099602 A2 | | 9/2006 |
| WO | WO 2007/081759 | * | 7/2007 |
| WO | 2007112116 A2 | | 10/2007 |

OTHER PUBLICATIONS http://www.teslamotors.com/blog2/?p=50, Tesla Motors, pp. 1-42.

(Continued)

*Primary Examiner* — Eugenia Wang
(74) *Attorney, Agent, or Firm* — David B. Kelley; Brooks Kushman P.C.

(57) ABSTRACT

A battery having a plurality of cell pairs arranged in an array is disclosed. The cells pairs are coupled longitudinally. Sense leads are provided on the ends of cell pairs to obviate providing a sense lead proximate the junction of the cell pair.

7 Claims, 7 Drawing Sheets

(56) References Cited

U.S. PATENT DOCUMENTS

| | | |
|---|---|---|
| 7,399,551 B2 | 7/2008 | Yagi et al. |
| 2002/0187390 A1 | 12/2002 | Kimoto et al. |
| 2003/0017383 A1 | 1/2003 | Ura et al. |
| 2003/0134189 A1 | 7/2003 | Kanai et al. |
| 2004/0137313 A1 | 7/2004 | Jaura et al. |
| 2007/0148536 A1 | 6/2007 | Kang et al. |
| 2007/0259263 A1 | 11/2007 | Shibuya et al. |
| 2008/0124618 A1 | 5/2008 | Shimoyama |
| 2008/0124627 A1 | 5/2008 | Shimoyama |
| 2008/0152993 A1* | 6/2008 | Seiler et al. .................. 429/92 |
| 2008/0182158 A1 | 7/2008 | Houchin-Miller et al. |
| 2009/0155680 A1 | 6/2009 | Maguire et al. |
| 2009/0208836 A1 | 8/2009 | Fuhr et al. |
| 2009/0311891 A1* | 12/2009 | Lawrence et al. ............ 439/121 |

OTHER PUBLICATIONS http://www.sae.org/technical/papers/1999-01-2626, Validation of Modified Wine-Rack Thermal Design for Nickel-Hydrogen Batteries in Landsat-7 Spacecraft Thermal Vacuum Test and in Flight, pp. 1-2.

\* cited by examiner

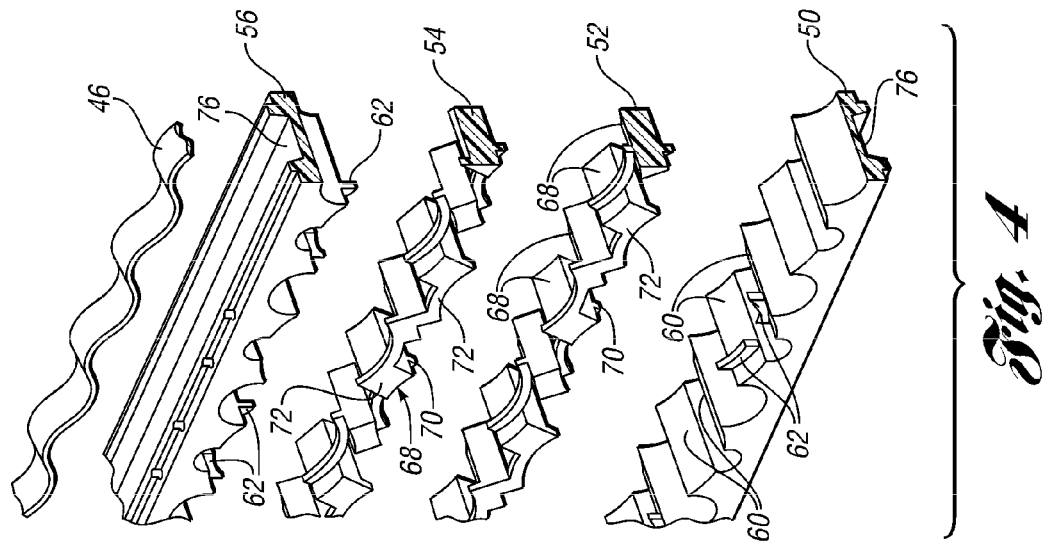
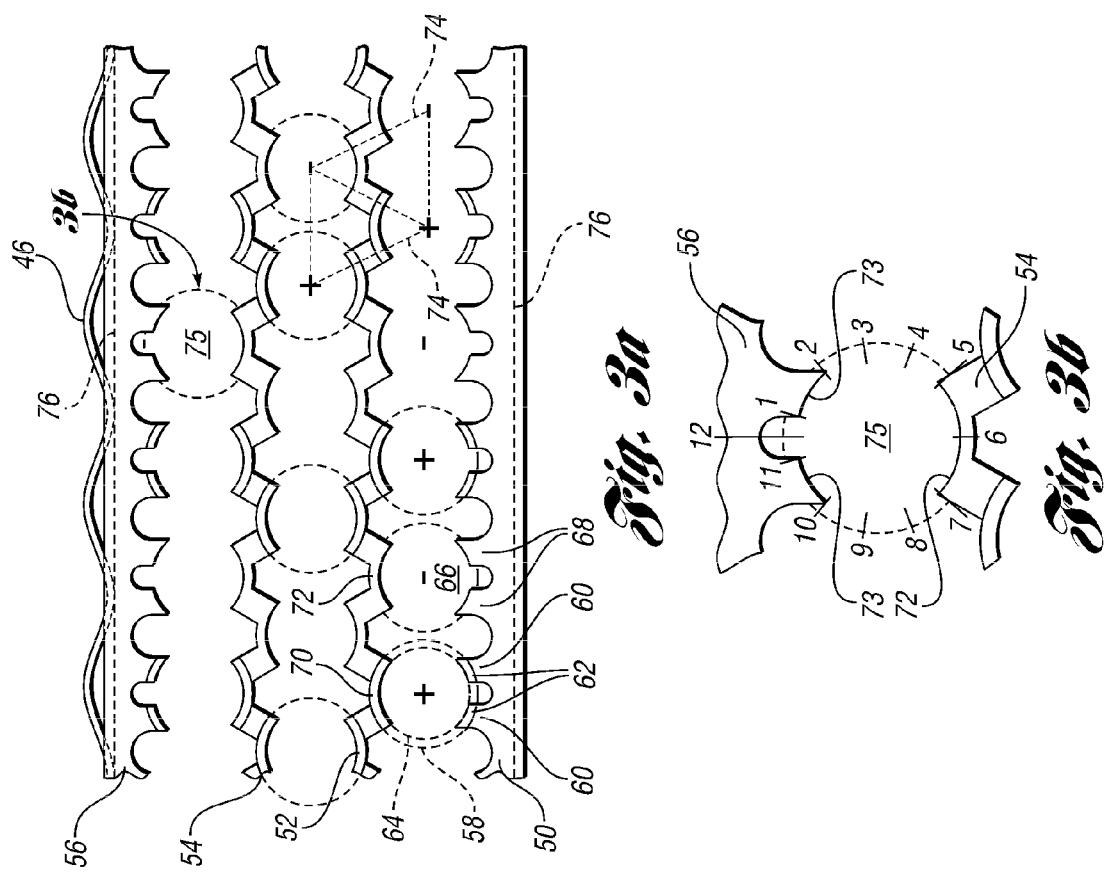

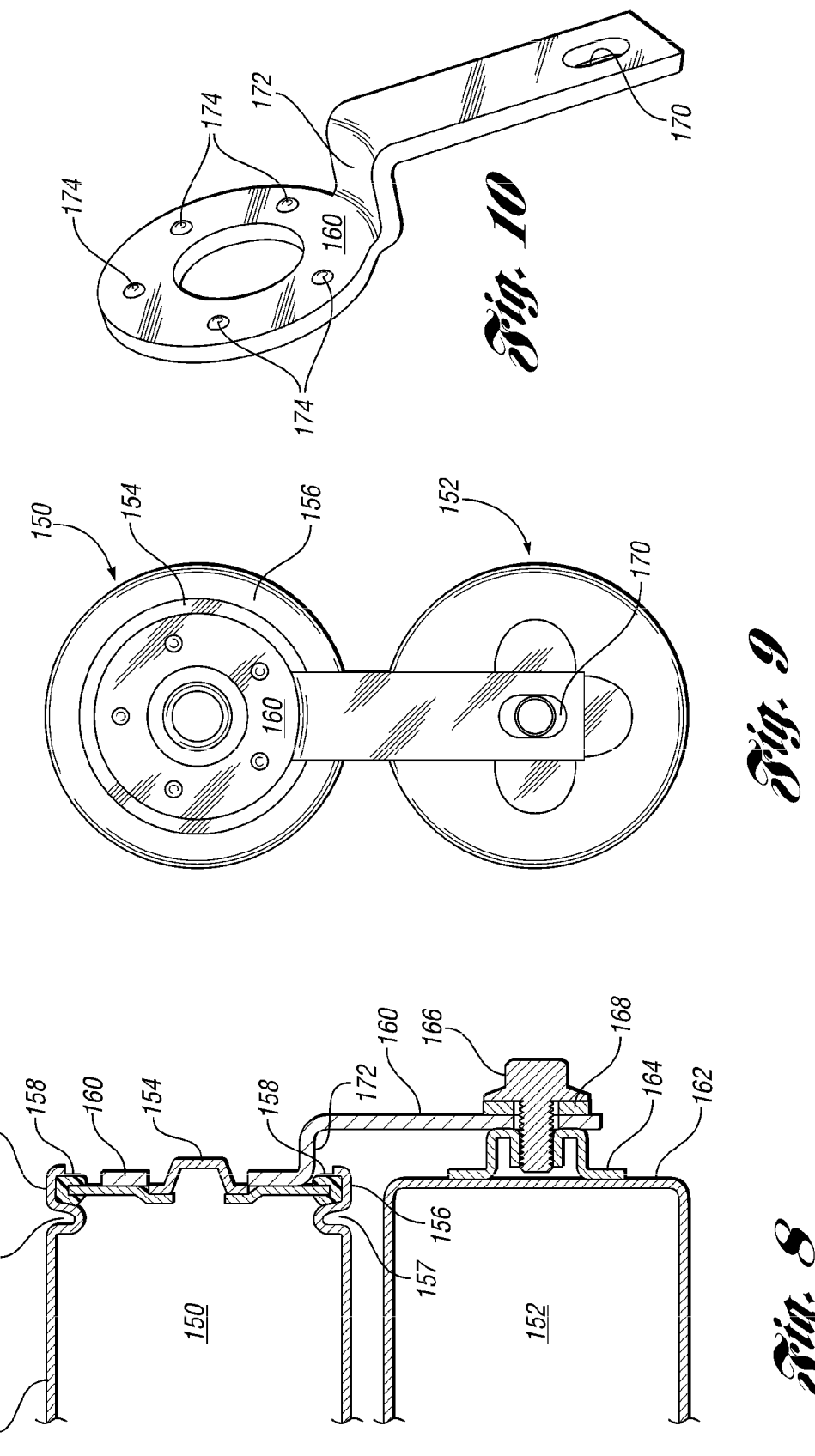

VOLTAGE DETECTION IN A BATTERY

BACKGROUND

1. Technical Field

The disclosure relates to measuring voltage in a battery comprised of a plurality of longitudinally coupled cell pairs.

2. Background Art

An electric vehicle (EV), a hybrid electric vehicle (HEV), and a fuel cell vehicle (FCV) generally include a high-voltage storage battery. In operation, the storage battery provides electric power to operate various components in the vehicle, such as an electric motor coupled to vehicle wheels. The storage battery generally includes a plurality of electrochemical cells that can store electric charge. For example, the storage battery may be a lithium-ion battery. Some issues that arise include: efficiently packaging an array of cells, effectively coupling the cells to provide the desired battery characteristics, providing sufficient cooling to ensure that the cells do not overheat, and providing sensors to all, or at least many, of the cells for measuring voltage and temperature to detect incipient cell operational problems.

SUMMARY

A battery is disclosed which includes first and second pluralities of cell pairs arranged in an array with positive terminals of first cell pairs and negative terminals of second cell pairs arranged proximate a first side of the array. First conductors are electrically coupled to a periphery of first cell pairs at an end proximate the first side and second conductors are electrically coupled to positive terminals of first cell pairs proximate the first side. Standoffs are welded to the negative terminals of second cell pairs. The standoffs are located proximate the first side of the array. A busbar electrically couples one of the plurality of first cell pairs with one of the plurality of second cell pairs. The busbar is welded to the interior portion of the end of the one first cell pair proximate the first side and is mechanically coupled to the standoff of the one second cell pair. Each first cell pair is mated with one of the plurality of second cell pairs at the first side and a plurality of busbars are provided to couple these mates at the first side.

Negative terminals of first cells pairs and positive terminals of second cell pairs are located near a second side of the array. The battery also includes third conductors electrically coupled to a periphery of second cell pairs at an end proximate the second side and fourth conductors electrically coupled to positive terminals of second cell pairs proximate the second side.

Cells of cell pairs proximate the first side are called close cells and cells of cell pairs proximate the second side are called far cells. Voltage of close cells of first cell pairs is determined by first and second conductors. Voltage of far cells of first cell pairs is determined by first and fourth conductors. Voltage of close cells of second cell pairs is determined by second and third conductors. Voltage of far cells of second cell pairs is determined using third and fourth conductors.

The battery includes standoffs welded to the negative terminals of first cell pairs proximate the second side of the array and busbars electrically coupling first cell pairs with second cell pairs proximate the second side of the array. A first end of the busbars is welded to the positive terminals of second cell pairs and second ends of the busbars are mechanically coupled to the standoffs welded to first cell pairs.

In battery arrays containing cell pairs, voltage can be measured by accessing conductors located at the ends of cell pairs, thereby avoiding having to access cell pairs near the junction point, which is located away from either end. In battery arrays containing individual cells, voltage can be measure by accessing conductors located at one end of cell pairs, which may facilitate alternative packaging solutions.

BRIEF DESCRIPTION OF THE DRAWINGS

FIG. 3a is an end view of the stacking supports with cells shown in phantom;

FIG. 3b is a portion of stacking supports indicating positions of support surfaces in relation to a cell shown in phantom FIG. 4 is a perspective, exploded view of the stacking supports and resilient bands;

FIG. 8 shows portions of two adjacent, coupled cells in cross section;

FIG. 9 shows an end view of two adjacent, coupled cells;

FIG. 10 shows a busbar in a perspective;

DETAILED DESCRIPTION

As those of ordinary skill in the art will understand, various features of the embodiments illustrated and described with reference to any one of the Figures may be combined with features illustrated in one or more other Figures to produce alternative embodiments that are not explicitly illustrated or described. The combinations of features illustrated provide representative embodiments for typical applications. However, various combinations and modifications of the features consistent with the teachings of the present disclosure may be desired for particular applications or implementations. Those of ordinary skill in the art may recognize similar applications or implementations consistent with the present disclosure, e.g., ones in which components are arranged in a slightly different order than shown in the embodiments in the Figures. Those of ordinary skill in the art will recognize that the teachings of the present disclosure may be applied to other applications or implementations.

Figure 1:
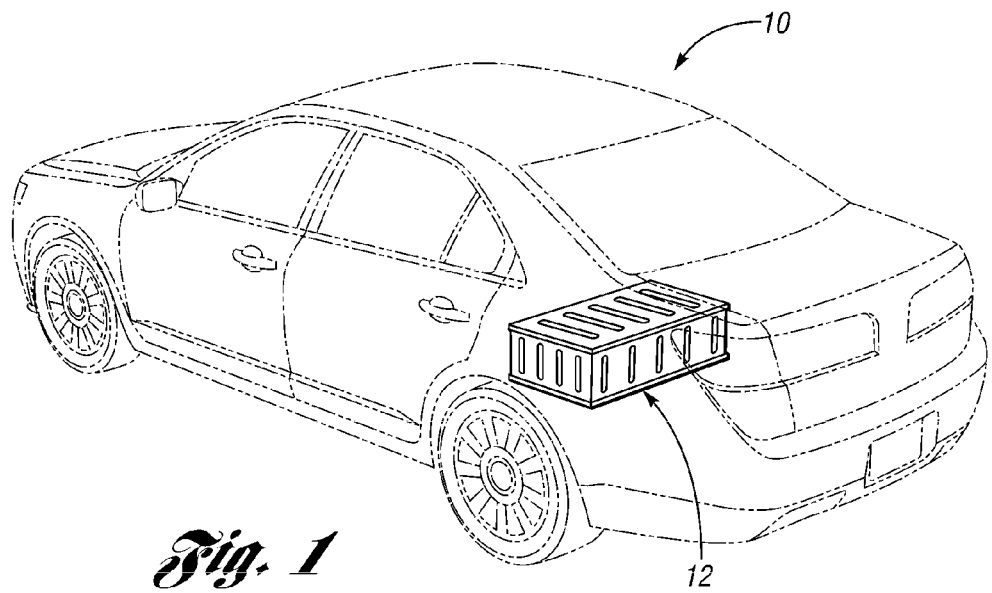
FIG. 1 is a schematic perspective view illustrating an automotive vehicle and a battery disposed within the vehicle.
Figure 2:
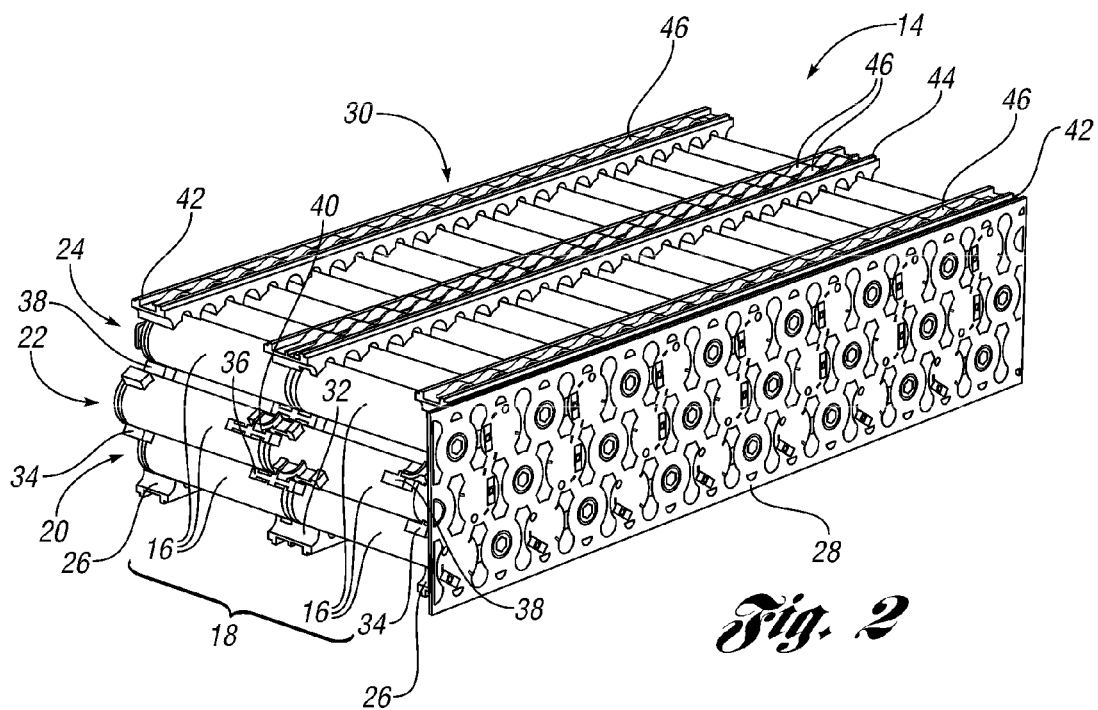
FIG. 2 is a perspective view illustrating a battery including a plurality of cells and a plurality of stacking supports.

In FIG. 1, a vehicle 10 having a battery 12 is shown. In FIG. 2, a perspective view of a battery 14 without the outer case is shown. Battery 14 has a plurality of cells 16 arranged into cell pairs 18 along a longitudinal axis of cells 16. The pairing of cells into a cell pair 18 is one non-limiting example. In another embodiment, individual cells are arranged in an array. In other embodiments, more than two cells are coupled longitudinally to form cell groups, which are then arranged to form an array of cells. A relevant factor in choosing the number of cells arranged longitudinally is cooling of the cells. If the cooling media is introduced at one end and travels along the length of the cell group, the last cell along the cooling path receives cooling media at a higher temperature than the first cell along the cooling path.

In the embodiment shown in FIG. 2 cell pairs are arranged into first, second, and third rows 20, 22, and 24, respectively, of cell pairs with support strips maintaining the relatives positions of cells 16. Lower support strips 26 are placed below the first row of cells 20 and arranged parallel and proximate plates 28 and 30 (30 is not visible in FIG. 2). Another lower support strip 32 is placed parallel to strips 26 and is generally centered between strips 26. More or fewer lower support strips 32 are provided depending on the number of cells coupled longitudinally. On top of the first row of cell pairs 20, outer middle support strips 34 and center middle support strip 36 are placed. On top of support strips 34 and 36, the second row 22 of cell pairs is placed. Another set of outer middle support strips 38 and center middle support strip 40 are placed over the second row 22 of cell pairs. The embodiment of FIG. 1 has three rows of cells pairs. In other embodiments fewer or more rows of cell pairs can be assembled, with the number of outer middle support strips and center middle support strips increased or decreased accordingly. Upper support strips 42 and 44 are provided on top of the top row of cell pairs, which is third row 24.

Support strips 26 and 42 have identical designs, but are oriented differently, with support surfaces (not readily viewed in this Figure) support strip 26 extending upwardly and support surfaces of support strip 42 extending downwardly, i.e., support surfaces engaging with cells. Support strips 44 and 32 are similarly identical, as well as support strips 34 and 38 and support strips 36 and 40.

Continuing to refer to FIG. 2, support strips 26 and 32 have a trough facing downwardly (not visible in the view provided in FIG. 2); and support strips 42 and 44 have a trough facing upwardly. A resilient band 46 is placed into the troughs associated with upper support strips. The strip is wavy with a bottom of the wave extending into a bottom surface of the trough. When a cover is placed over battery 14, resilient bands 46 are squeezed to provide compression to maintain the relative positions of the cells within battery 14.

In FIG. 3a, portions of support strips 50 (lower), 52 (first middle), 54 (second middle), and 56 (upper) are shown. The portion of support strip 50 shown can support six cells on one end, such as the close end viewed in FIG. 3. Another support strip is provided on the far end of the cells (or cell pairs), such support strip is not visible in FIG. 3a. A cell 58 (shown in phantom in FIG. 3a) can be placed onto support surfaces 60. Extending upwardly from support surfaces 60 are retaining flanges 62. Cell 58 has an annular notch 64 near the positive terminal end which engages with retaining flanges 62. In an alternative embodiment, retaining flanges 62 are connected to form a single retaining flange. To the right of cell 58 is another cell 66 received by support surfaces 68. In one embodiment, support surfaces are concave to cradle the outside cylindrical surface of the cells.

A row of cells sitting upon support strip 50 alternate between having a positive terminal end sitting on support strip 50, cell 58 being such an example, and a negative terminal end sitting on support strip 50, cell 66 being such an example. Thus, within a row of cells, negative terminal ends are adjacent to positive terminal ends and vice versa.

The first middle support strip 52 is placed over the first row of cells. Support strip 52 has a retaining flange extending downwardly and engaging with annular notch 64 of cell 58. Support strip 52 has a lip 72 extending downwardly proximate cell 66. The front edge of cell 66 is behind lip 72. Lip 72 can prevent cell 66 from sliding out. In addition to being placed over the first row cells, first middle support strip 52 provides support for second row cells. Second row cells are offset from first row cells due to the support structure of first middle support strip 52 so that they are in a close-packed array. The closest pack arrangement is when the centers of three proximate cells are equidistant from each other, i.e., forming an equilateral triangle. However, in the embodiment shown in FIG. 3a, the centers of three proximate cells form isosceles triangles 74, which provides a close-packed array, although not a closest-packed array.

In FIG. 3b, second middle support strip 54 contacts cell 75 between the 5 o'clock and 6 o'clock positions and between the 6 o'clock and 7 o'clock positions. The actual support surfaces on which cell 75 sits are not visible in this view because they are blocked by lip 72. Upper support strip 56 extends downwardly and also contacts cell 75. The support surfaces are not visible due to being blocked by lips 73. These upper support surfaces contact cell 75 between the 10 and 11 o'clock position and between the 1 and 2 o'clock positions. Note that all the cells in the battery are nominally identical, except in orientation and coupling. However, different reference numerals are assigned to various cells for illustration purposes to identify features relevant to the disclosure.

Referring back to FIG. 3a, second middle support strip 54 is placed over the second row of cells and supports the third row of cells. Over the top of the third row of cells is upper support strip 56. The upper surface of strip 56 has a trough 76 into which a resilient band 46 is placed. Resilient band 46 can be a metallic strip. Any suitable springy or resilient material can be used in trough 76; furthermore, other suitable shapes can be used in place of the wavy spring shown in FIG. 3a.

A perspective, exploded view of the strips is shown in FIG. 4. From the view in FIG. 4, it can be seen that retaining flanges 70 on support strip 52 are set back from a front surface of support strip 52. Lips 72 are flush with the front surface of support strip 52. Also, a pair of support surfaces 68 on support strip 52 cradles an end of a cell (not shown) and another pair of support surfaces extending down from support strip 54 are also in contact with the cell, so that the cell is held in place by four support surfaces on its periphery.

Figure 5:
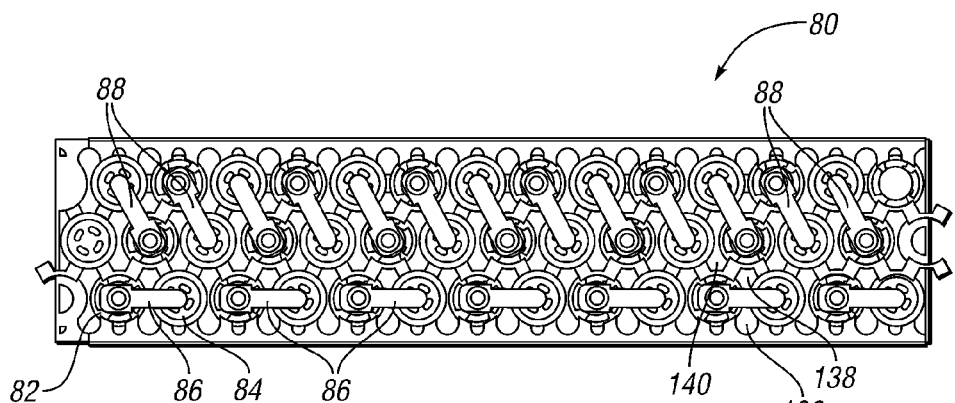
FIG. 5 is an end view of a battery showing busbars coupling cells.
Figure 6:
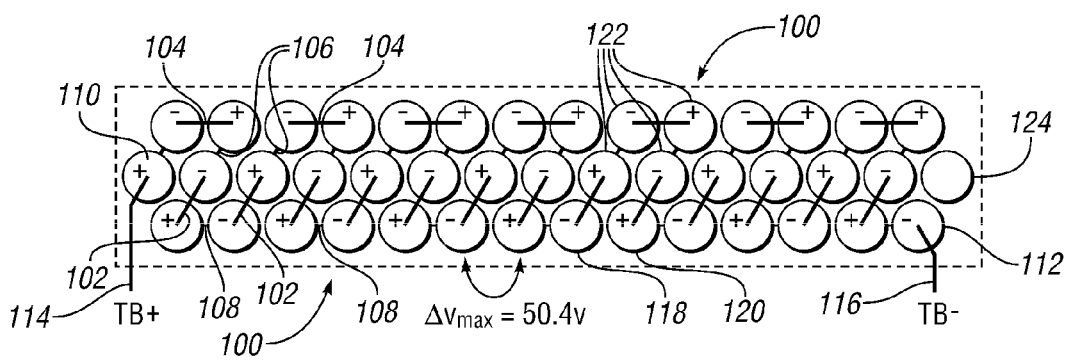
FIG. 6 is an end view schematic of a battery showing busbars coupling cells on the close end and a portion of busbars coupling cells at the far end.

In FIG. 5, an end view of a battery 80 is shown having three rows of cells with fourteen cells per row alternating between positive and negative terminals pointing outward. In FIG. 5, the negative terminal of cell 82 and the positive terminal of cell 84 are visible. Seven busbars 86 couple adjacent cells along the bottom row of cells. Thirteen busbars 88 couple cells in row two with cells in row three. There are also busbars provided on the other end of the cells, which is illustrated schematically in FIG. 6, in which a battery has forty-two cell pairs arranged in three rows. Only the close cell of the cell pair is visible in FIG. 6. At least a portion of all the busbars are visible in FIG. 6, with busbars 102 and 104 coupling close cells of the cell pairs and busbars 106 and 108 coupling far cells of the cell pairs. Cell 110 is at the most positive potential and a battery lead 114 exits battery 100. Similarly, cell 112 is at the most negative potential and a battery lead 116 exits battery 100. If the potential within a single cell is 4.2 V, each cell shown in FIG. 6 represents a cell pair, and there are 42 cell pairs, the potential between lead 114 and 116 is 176 V. It is desirable to avoid shorting between adjacent cells, such as cells 118 and 120. There are 10 cells between cells 118 and 120: one behind each of cells 118 and 120, as well as four pairs of cells 122. Between the terminal ends of cells 118 and 120, there is a potential difference of 50.4 V (12 cells at 4.2 V per cell). An air gap of 1.6 mm is sufficient to avoid shorting.

A 2 mm gap is provided to allow a margin of safety. The desired gap may vary depending on the type of cell, how the cells are coupled, the type of vibration that the battery is subjected to, and the desired safety factor. In FIG. 6, battery 100 has a dummy cell location 124 due to the close-packed array arrangement causing cells to not line up vertically. In such embodiment, dummy cell location 124 can be used for cable leads to be brought in and out of battery 100, e.g., sensor wires. In another embodiment, the right hand side of battery 100 can be brought in with only a portion of dummy cell location 124 remaining. In yet another embodiment, two additional cells are provided in location 124 and the cell in location 124 has most negative potential.

Figure 7:
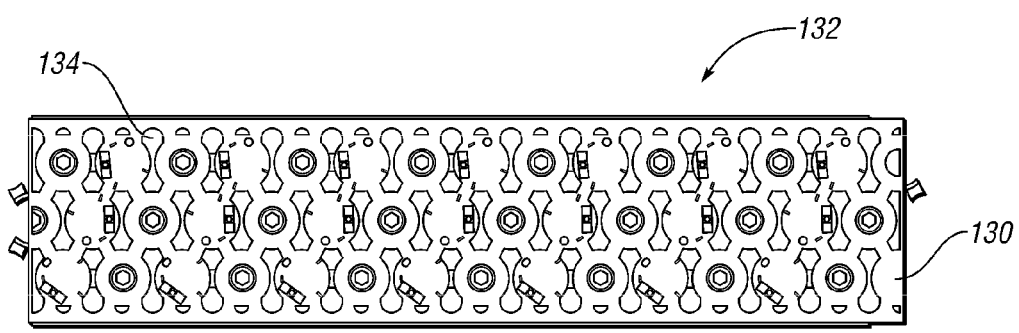
FIG. 7 is an end view of a battery with a cover over the end showing inlet ports for introducing cooling air to the cells.

Cells liberate energy during charging/discharging operations. To avoid overheating and damaging cells, it is typical to cool the cells. In one embodiment, cooling air is provided longitudinally along cell pairs. In FIG. 7, an end plate 130 of battery 132 has openings 134 for allowing cooling air to pass into the compartment with the cells. At the far end, the air exits the compartment with the cells. Referring again to FIG. 5, voids 136, 138, and 140 roughly line up with openings 134.

In FIG. 8, portions of two adjacent cells 150 and 152 are shown in cross section. A positive terminal 154 of cell 150 is joined with cell body 155 by crimp joint 156. A short circuit between positive terminal 154 and cell body 155 is avoided by providing an insulator 158 within crimp joint 156 to separate the two. A notch 157 is located proximate crimp joint 156. A busbar 160 is welded to positive terminal 154. Busbar 160 extends from positive terminal 154 toward cell 152. Cell 152 has a negative terminal 162 pointing in the same direction as positive terminal 154 of cell 150. A stand off 164 is coupled to negative terminal 162, in one embodiment by welding. An opening in busbar 160 is placed proximate standoff 164. A washer 168 is placed over busbar 160. Washer 168 is not included in some embodiments. Standoff 164 is internally threaded to permit engagement with a bolt 166 having suitable threads. Bolt 166 holds busbar 160 in place. The potentials of positive terminal 154 of cell 150, busbar 160, standoff 164, washer 168, and bolt 166 are substantially identical as they are in electrical communication.

An end view of adjacent cells 150 and 152 is shown in FIG. 9. Positive terminal 154 is provided in an inner portion of the end of cell 150. Crimp joint 156, which is at a negative polarity with respect to positive terminal 154, occupies an outer portion of the end of cell 150. Busbar 160 extends toward cell 152. Busbar 160 has a slotted hole 170.

A perspective view of busbar 160 is shown in FIG. 10 showing slotted hole 170, zig 172 (which is also shown in FIG. 8), and locations 174 for welds. Zig 172 is provided so that busbar 160 does not come into contact with crimp joint 156 (shown in FIG. 8). As busbar 160 is at the potential of positive terminal 154 and crimp joint 156 is at the negative potential of cell body 155, contact between busbar 160 and crimp joint 156 would cause a short circuit.

Figure 11:
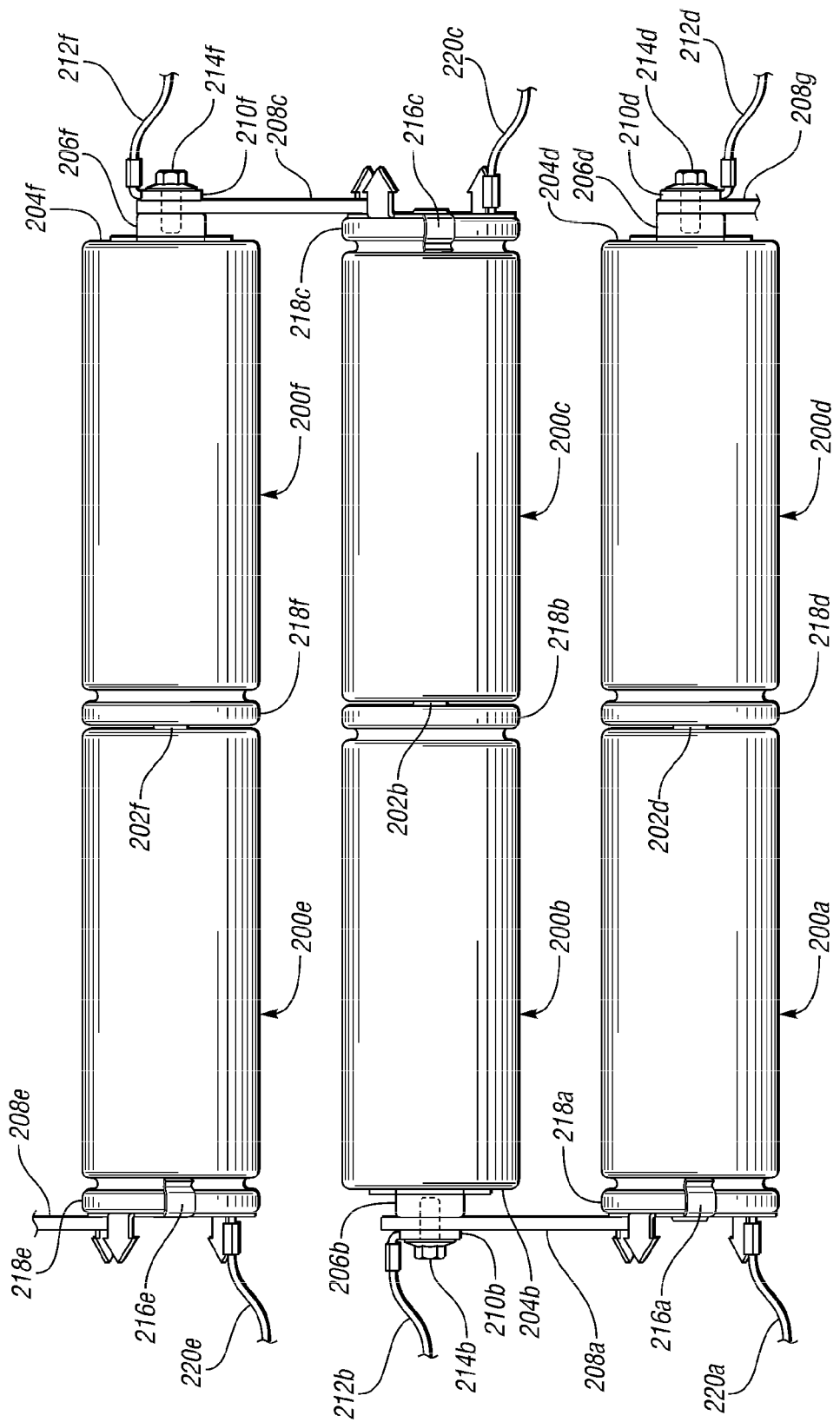
FIG. 11 shows two longitudinally coupled cell pairs coupled at one end by a busbar.

In FIG. 11, six cells 200a-f, which are a small portion of a cell array, are shown. Cells 200a and 200d are coupled longitudinally and form a first cell pair. Cells 200b and 200c are coupled longitudinally and form a second cell pair; and cells 200e and 200f are coupled longitudinally to form a third cell pair. Only a portion of positive terminals 202b, 202d, and 202f are visible in FIG. 11. Negative terminals 204b, 204d, and 204f for cells 200b, 200d, and 200f are provided with stand offs 206b, 206d, and 206f, respectively. As discussed above in regards to the arrangement of cells in an array, a positive terminal of one cell is adjacent a negative terminal of another cell, such as with positive terminal of cell 200a (positive terminal not visible in FIG. 11, but is at leftmost side of FIG. 11) being adjacent negative terminal 204b of cell 200b. The positive terminal of cell 200a is electrically coupled to negative terminal 204b of cell 200b via busbar 208a. Busbar 208a couples with negative terminal 204b of cell 200b through standoff 206b and bolt 214b; thus, all these elements are at the same electric potential. In the embodiment shown in FIG. 11, a washer 210b is provided between standoff 206b and bolt 214b. A voltage sense lead 212b is coupled to washer 210b. In an alternative embodiment, no washer 210b is provided and voltage sense lead 212b is coupled to busbar 208a or to standoff 206b. The surfaces of the cylindrical bodies of cells 200a-f that are visible in FIG. 11 are of a negative potential with respect to their positive terminals (e.g., in regards to cell 200d, positive terminal 202d is positively charged with respect to the cylindrical body of cell 200d, which is negatively charged. Snap rings 216a, 216c, and 216e are coupled with crimp joints 218a, 218c, and 218e of cells 200a, 200c, and 200e, respectively. The snap rings will be discussed in more detail below in regards to FIGS. 12 and 13. Snap rings 216a, 216c, and 216e are provided with sense leads 220a, 220c, and 220e. Snap rings 216a, 216c, and 216e are at the electric potential of negative terminals of cells 200a, 200c, and 200e, respectively. Thus, by measuring the potential difference between sense lead 212b (at same potential as busbar 208a) and sense lead 220a (at same potential as snap ring 216a), the potential across cell 200a can be determined. The potential across cell 200b, which is in a cell pair with cell 200c, is determined by measuring voltage between sense lead 212b and sense lead 220c coupled to snap ring 216c. For cell pairs, potential is determined through measurements at both ends of the cell pair. However, this presents an advantage over taking measurements at the junction between cells of a cell pair. The measurement configuration shown obviates the need to take a measurement proximate negative terminal 204a to determine the voltage across cell 200a The voltage across each of the cells shown can be measured according to the following table.

| Cell | Negative | Positive |
| --- | --- | --- |
| 200a | Sense lead 220a | Sense lead 212b |
| 200b | Sense lead 212b | Sense lead 220c |
| 200c | Sense lead 220c | Sense lead 212f |
| 200d | Sense lead 212d | Sense lead 220a |
| 200e | Sense lead 220e | Sense lead (not shown) associated with busbar 208e |
| 200f | Sense lead 212f | Sense lead 220e |

The table indicates that the voltages across the six cells can be determined via seven voltage measurements, as the table of twelve elements shows five redundancies. It would pose a challenge to place a conductor proximate the coupling joint between a longitudinally-coupled cell pair. Such a challenge is obviated by an embodiment of the present disclosure in which all voltage measurements are taken at one end or the other end of longitudinally-coupled cell pairs. Voltage measurements, as described in conjunction with FIG. 11 regarding three cell pairs, can be extended to any number of cell pairs. In one embodiment, 84 cells are arranged in 42 cell pairs and electrically serially. Via 85 sense leads, the voltage across each of the 84 cells can be determined.

Figure 12:
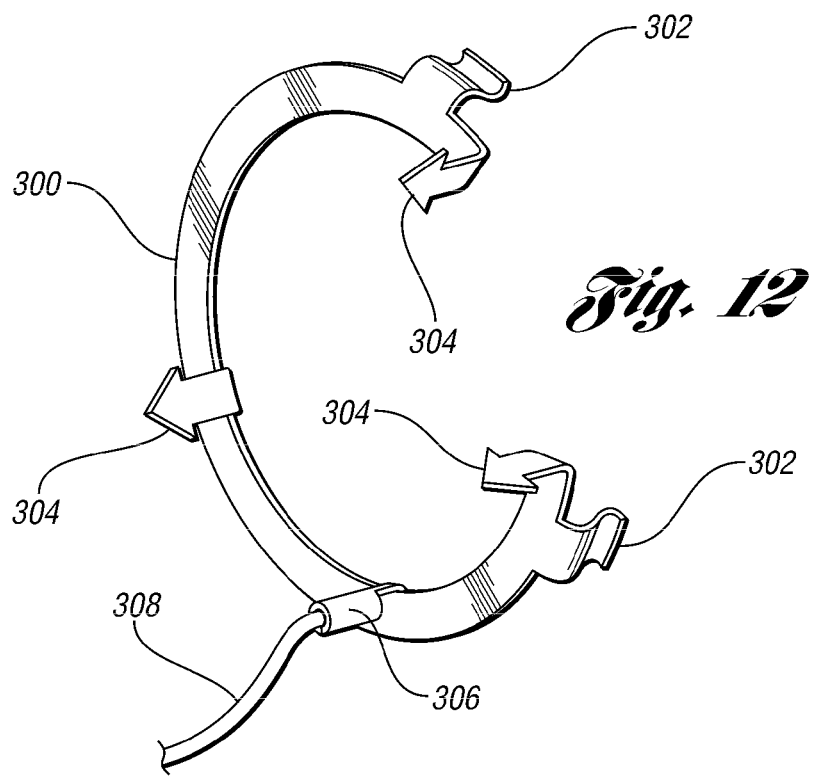
FIG. 12 shows a snap ring in a perspective view.
Figure 13:
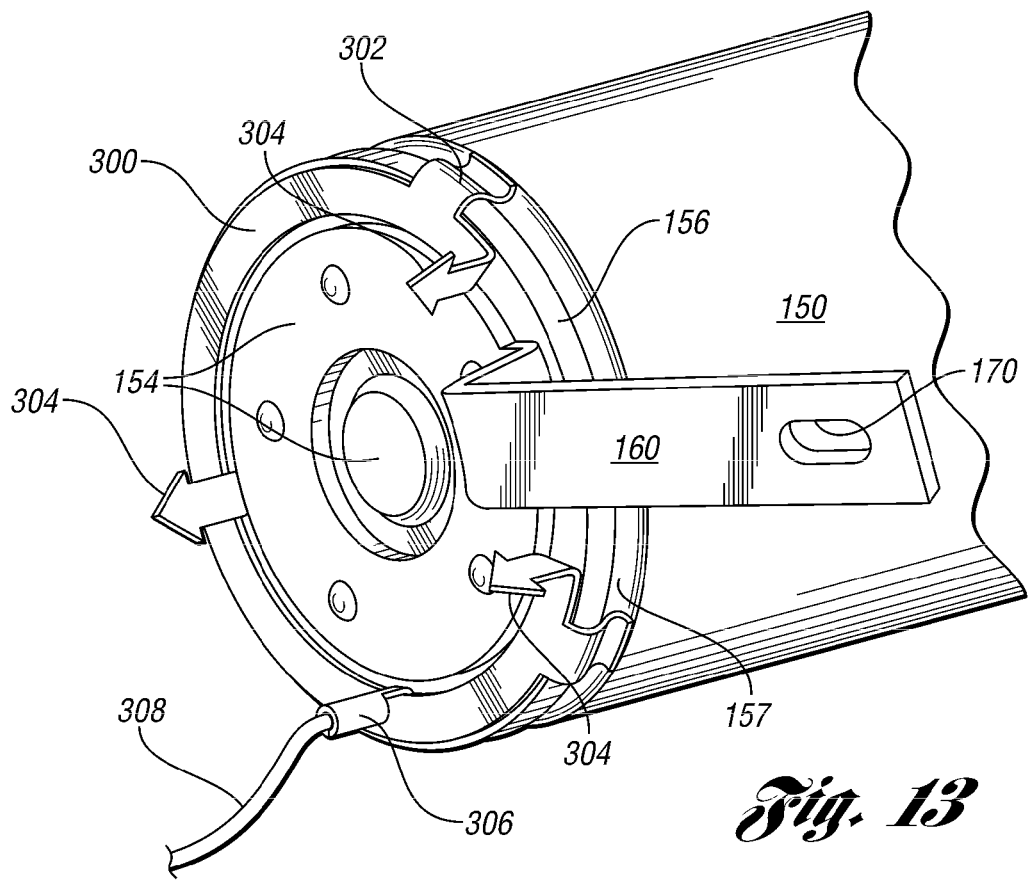
FIG. 13 shows an end of a cell with a busbar and the snap ring coupled thereto.

In FIG. 12, snap ring 300 is shown to include: clips 302 to couple with the notch on the cell, barbs 304 to couple with a battery cover, and a barrel receptacle 306 of conductive material. In the view shown in FIG. 12, two clips 302 are visible. However, in one embodiment, at least one additional clip is provided near the middle of the three barbs 304. However, it is not visible in this view as the third clip is blocked from view by the body of snap ring 300 and barb 304. A voltage sense lead 308 can be provided in barrel receptacle 306. In FIG. 13, clips 302 are engaged with notch 157 of cell 150 to secure snap ring 300 to cell 150. Snap ring 300 sits over crimp joint 156 without touching positive terminal 154 or busbar 160. Snap ring 300 is not a complete ring, but roughly three-quarters of a ring, from 190 degrees to 315 degrees. The break in the ring of snap ring 300 is aligned with the portion of busbar 160 which extends out to slot 170. Busbar 160 is at a different potential than snap ring 300 and thus cannot be in contact. The break in snap ring 300 allows busbar 160 a place to extend from positive terminal 154 without interference. Barbs 304 are shaped to enter pockets molded in a cover plate and to resist removal once inserted into the cover plate.

Figure 14:
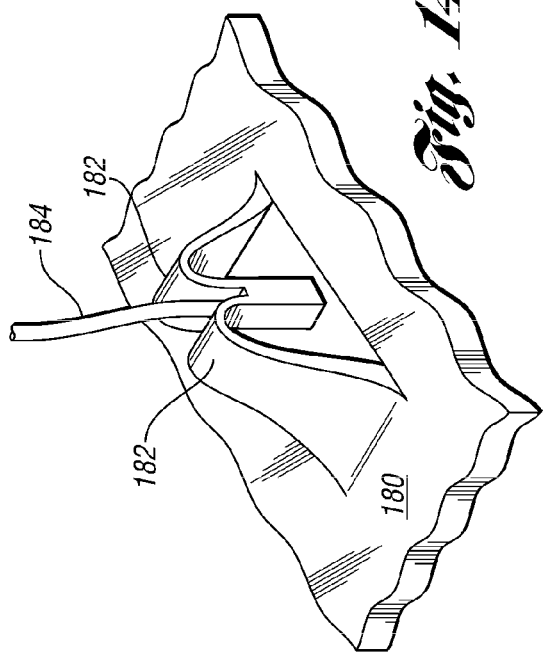
FIG. 14 shows a portion of an end plate.
Figure 16:
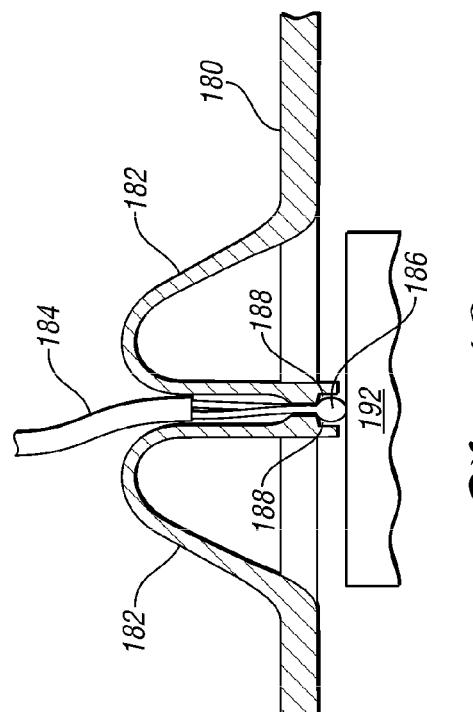
FIGS. 15 and 16 show a cross section of a portion of an end plate with a temperature sensor inserted.
Figure 15:
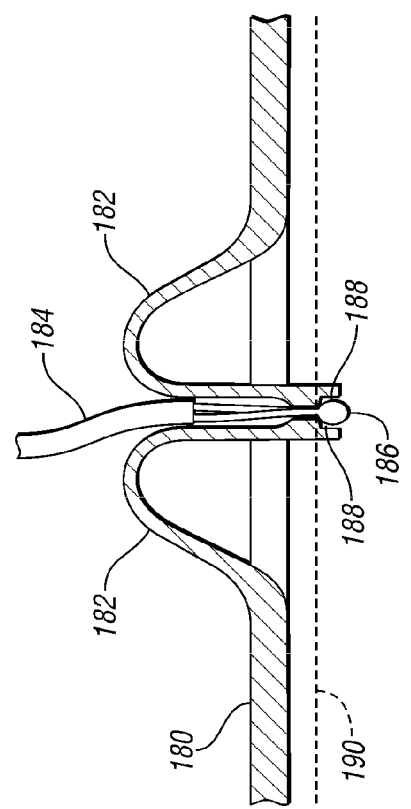

In FIG. 14, a perspective view of a portion of a face plate 180 is shown, which has leaf springs 182 molded in. A lead 184 from a temperature sensor is shown coming out of the leaf springs 182. In FIG. 15, a cross section of leaf springs 182 within face plate 180 is shown. A bead 186 of a thermistor, or other suitable temperature measuring sensor such as a thermocouple, is shown tucked into pockets 188 molded in leaf springs 182. Bead 186 is inserted in leaf springs 182, but is unlikely to pull out due to lodging in pockets 188. Leaf springs 182 are in an unsprung position in FIG. 15. Dashed line 190 shows the average height of an end of a cell when face plate 180 is attached to the array of cells. In FIG. 16, a cross section of face plate 180 is shown, as installed, proximate a cell 192. The tip of leaf springs 182 in which pockets 188 and bead 186 are contained are forced to move upward during installation. Leaf springs 182 are in a deflected or sprung position in FIG. 14 such they exert a force against cell 192, thereby holding bead 186 in contact with cell 192. By spring loading, a certain amount of variation in the distance between cell 192 and face plate 180 can be accommodated without losing contact between bead 186 and cell 192. Illustrated in FIGS. 14-16 is a portion of the face plate. A mounting location, including leaf springs, and pockets 188 can be provided for each cell in a cell array proximate the face plate.

While the best mode has been described in detail, those familiar with the art will recognize various alternative designs and embodiments within the scope of the following claims. Where one or more embodiments have been described as providing advantages or being preferred over other embodiments and/or over prior art in regard to one or more desired characteristics, one of ordinary skill in the art will recognize that compromises may be made among various features to achieve desired system attributes, which may depend on the specific application or implementation. These attributes include, but are not limited to: cost, strength, durability, life cycle cost, marketability, appearance, packaging, size, serviceability, weight, manufacturability, ease of assembly, etc. The embodiments described as being less desirable relative to other embodiments with respect to one or more characteristics are not outside the scope of the disclosure as claimed.

What is claimed:

1. A battery, comprising:
a first and a second cell pair having a first and a second cell, wherein the first and the second cell pairs are arranged in an array with positive terminals of first cell pairs and negative terminals of second cell pairs arranged proximate a first side of the array;
a first sense lead electrically coupled to a first crimp joint of the first cell of the first cell pair;
a first busbar coupled to a positive terminal of the first cell of the first cell pair; and
a second sense lead electrically coupled to the first busbar.

2. The battery of claim 1 wherein voltage of the first cell of the first pair is determined by measuring a voltage difference between the first sense lead and the second sense lead.

3. The battery of claim 1, further comprising:
a standoff coupled to a negative terminal of the second cell of the first cell pair; and
a third sense lead electrically coupled to the standoff wherein voltage of the second cell of the first cell pair is determined by measuring a voltage difference between the first sense lead and the third sense lead.

4. The battery of claim 1, further comprising:
a snap ring coupled to the first crimp joint in a snap-fit relationship wherein the snap ring is further coupled to the first sense lead.

5. The battery of claim 1, further comprising:
a standoff coupled to a negative terminal of the first cell of the second cell pair, wherein the standoff is further electrically coupled to the second sense lead; and
a third sense lead electrically coupled to a second crimp joint of the second cell of the second cell pair;
wherein voltage of the first cell of the second cell pair is determined by measuring a voltage difference between the third sense lead and the second sense lead.

6. The battery of claim 1, further comprising:
a first standoff coupled to a negative terminal of the second cell of the first cell pair;
a third sense lead electrically coupled to the first standoff;
a second standoff coupled to a negative terminal of the first cell of the second cell pair, wherein the second standoff is further coupled to the second sense lead;
a fourth sense lead electrically coupled to a crimp joint of the second cell of the second cell pair; and
a second busbar coupled to a positive terminal of the second cell of the second cell pair wherein:
voltage of the first cell of the first cell pair is determined by measuring a voltage difference between the first sense lead and the second sense lead;
voltage of the second cell of the first cell pair is determined by measuring a voltage difference between the first sense lead and the third sense lead;
voltage of the first cell of the second cell pair is determined by measuring a voltage difference between the fourth sense lead and the second sense lead; and
voltage of the second cell of the second cell pair is determined by measuring a voltage difference between the third sense lead and the second sense lead.

7. The battery of claim 6 wherein the first and the second standoffs are internally threaded, the battery further comprising:
a plurality of threaded bolts coupled with the first and the second standoffs.

* * * * *